(12) United States Patent
Liu

(10) Patent No.: US 6,218,850 B1
(45) Date of Patent: Apr. 17, 2001

(54) APPARATUS FOR SELECTING HIGH-RELIABILITY INTEGRATED CIRCUITS

(75) Inventor: Hsing-Ming Liu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/296,179

(22) Filed: Apr. 22, 1999

(51) Int. Cl.[7] .............................. G01R 31/02; H05K 1/00
(52) U.S. Cl. .................... 324/755; 324/760; 324/765; 439/65; 439/74
(58) Field of Search .................... 324/755, 765, 324/760; 439/65, 74

(56) References Cited

U.S. PATENT DOCUMENTS 5,672,981 * 9/1997 Fehrman ........................ 324/760
6,072,326 * 6/2000 Akram ........................... 324/765

* cited by examiner

Primary Examiner—Safet Metjahic
Assistant Examiner—Anjan K Deb

(57) ABSTRACT

An apparatus provided for selecting high-reliability integrated circuits is disclosed. The apparatus includes pattern boards, feedthrough cards, a main board, a signal board, a plurality of daughter cards and a plurality of socket cards. The integrated circuits are supported by sockets in the plurality of socket cards. The pattern boards provide testing signals. The feedthrough cards are used to direct the testing signals into the main board and the signal board. Then the signals pass through electronic circuits in the main board and electronic circuits in the signal board. Moreover, the signals are sent to electronic circuits in the plurality of daughter cards. Finally, the testing signals are sent to the tested integrated circuits in the plurality of socket cards.

10 Claims, 2 Drawing Sheets

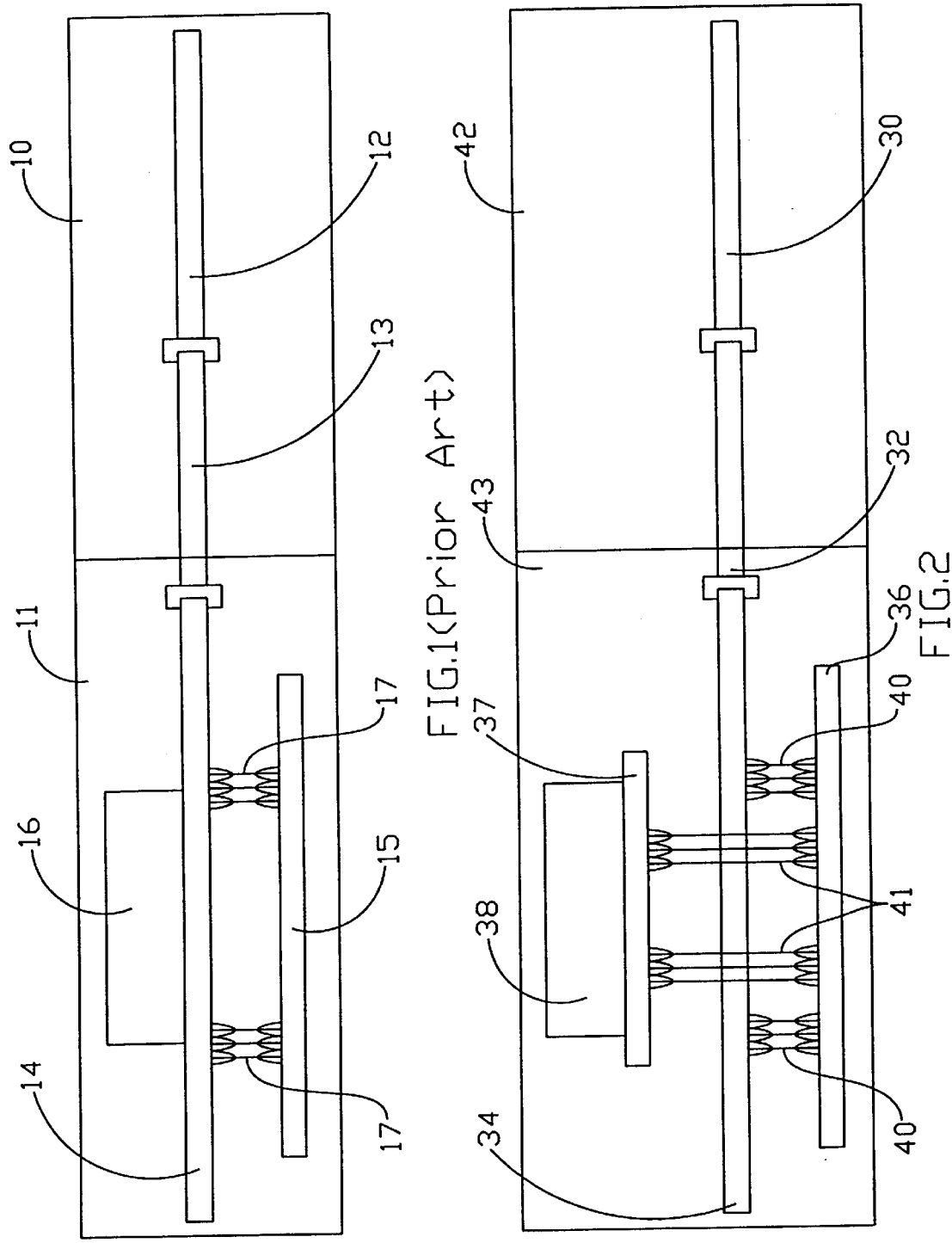

APPARATUS FOR SELECTING HIGH-RELIABILITY INTEGRATED CIRCUITS

BACKGROUND OF THE INVENTION

1. Field of the Invention

The present invention relates to an apparatus for testing integrated circuits, and more particularly, to an apparatus for selecting high-reliability integrated circuits.

2. Description of the Prior Art

FIG. 1(profile) shows a known apparatus provided for selecting high-reliability integrated circuits in the testing environment. The pattern board 12 and the feedthrough card 13 are placed within the room temperature 10 while the main board 14, the daughter cards 15, the sockets 16 supporting the integrated circuits and the conductors 17 like needle are placed within the oven 11. In order to keep the integrated circuits the quality of high reliability, a burn-in testing must be done. The apparatus serves to induce accelerated aging of the integrated circuits and failure of those integrated circuits which are not capable of withstanding the stresses applied, such as higher temperature, during the test.

Because the sockets 16 cannot be removed from the main board 14, the main board 14 must be modified or redesigned when integrated circuits of various packages are tested. That is to say, different package of integrated circuits correspond to different main boards 14 with different socket(s). And the main board 14 is rather a large-sized printed circuit board, so this increases the cost for testing. Furthermore, the known apparatus cannot provide enough testing signals and ground pins for high pin count products. For the foregoing reason, there is a need for the structural apparatus of the present invention.

SUMMARY OF THE INVENTION

In accordance with the present invention, an apparatus is provided for selecting high-reliability integrated circuits. The apparatus includes pattern boards, feedthrough cards, a main board, a signal board, a plurality of daughter cards, a plurality of socket cards and a plurality groups of conductors like needle in rows. The integrated circuits are supported by sockets in the socket cards. The apparatus is placed within an oven except the pattern boards and the feedthrough cards to do a burn-in testing for selecting high-reliability integrated circuits. When the apparatus includes two pattern boards and two feedthrough cards, one pattern board, one feedthrough card and the main board all lie in the same plane and then the other pattern board, the other feedthrough card and the signal board all lie in another same plane. The signal board, the daughter cards and the socket cards can be removed from the apparatus.

The pattern boards provide testing signals. And then the testing signals are amplified. The feedthrough cards are used to direct the testing signals into the main board and the signal board. Then the signals pass through electronic circuits in the main board and electronic circuits in the signal board. Moreover, the signals are sent to electronic circuits in the plurality of daughter cards via some groups of conductors like needle in rows. Finally, the testing signals are sent to the tested integrated circuits in the plurality of socket cards via some groups of conductors like needle in rows.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1(profile) shows a known apparatus provided for selecting high-reliability integrated circuits in the testing environment;

FIG. 2(profile) shows an apparatus provided for selecting high-reliability integrated circuits in the testing environment according to one embodiment of the present invention.

DESCRIPTION OF THE PREFERRED EMBODIMENT

Figure 3:
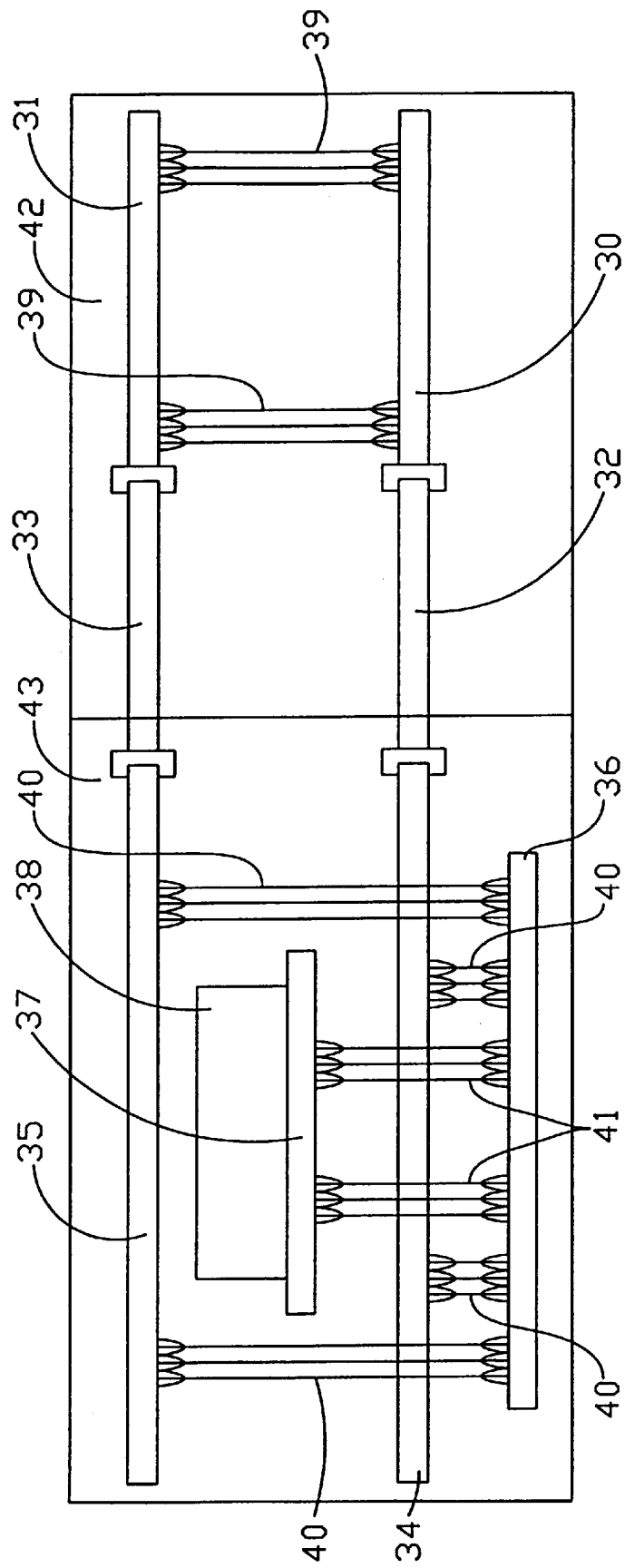
FIG. 3(profile) shows an apparatus provided for selecting high-reliability integrated circuits in the testing environment according to another embodiment of the present invention.

FIG. 2(profile) shows an apparatus provided for selecting high-reliability integrated circuits in the testing environment according to one embodiment of the present invention and FIG. 3(profile) shows an apparatus provided for selecting high-reliability integrated circuits in the testing environment according to another embodiment of the present invention. The structural apparatus of FIG. 3 is more suitable than the structural apparatus of FIG. 2 for testing the integrated circuits of higher pin count packages. Because the structural apparatus of FIG. 3 further includes the other pattern board 31, the other feedthrough card 33 and the signal board 35, the testing signals provided are enough. And then the test will be complete and effective.

In the following discussion, FIG. 3 is used for the detailed description. Actually there are a plurality of daughter cards 36 and a plurality of socket cards 37 in FIG. 3. So FIG. 3 is a simply indicated figure. There are a plurality of sockets 38 supporting the integrated circuits tested in every socket card 37. A burn-in testing must be done for selecting high-reliability integrated circuits, therefore the integrated circuits tested are placed within the oven 43, for example, of 125° C. But part of the apparatus is placed within room temperature 42. One pattern board 30, one feedthrough card 32 and the main board 34 all lie in the same plane and then the other pattern board 31, the other feedthrough card 33 and the signal board 35 all lie in another same plane. The daughter cards 36 are fixed under the main board 34 by screws and the socket cards 37 are fixed over the main board 34 by screws, so the plurality of daughter cards 36 and the plurality of socket cards 37 can be removed from the apparatus. Various daughter cards 36 and various socket cards 37 are needed for the integrated circuits of various packages. Sockets 38 in various socket cards 37 are suitable for various packages, such as BGA (Ball Grid Array) packages, PGA (Pin Grid Array) packages, QFP (Quad. Flat Packages), SOP (Small Outline Packages), TSOP (Thin Small Outline Packages), DIP (Dual In-Line Packages), and so on. The apparatus can test integrated circuit of any pin count package, such as 436 pins package.

The pattern board 30, the other pattern board 31, the main board 34 and the signal board 35 are all multilayer printed circuit boards. There are four groups of signal-transmission connections of 100 pins in the side of every board. The pattern board 30 provides 256 different testing signals, enough power voltages and ground pins. And either does the other pattern board 31. That is, the main board 34 and the signal board 35 can provide 1 to 512 different testing signals. Conductors 39 like needle in rows are used for signal transmission between the pattern board 30 and the other pattern board 31. The feed through card 32, the other feedthrough card 33, the daughter cards 36 and the socket cards 37 are also multilayer printed circuit cards. First, the pattern board 30 and the other pattern board 31 provide testing signals. And then the testing signals are amplified. The feedthrough card 32 and the other feedthrough card 33 are used to direct the testing signals into the main board 34 and the signal board 35. Then the signals pass through electronic circuits in the main board 34 and electronic circuits in the signal board 35. Moreover, the signals are sent to electronic circuits in the plurality of daughter cards 36 via some groups of conductors 40 like needle in rows. Finally, the testing signals are sent to the tested integrated circuits in the plurality of socket cards 37 via some groups of conductors 41 like needle in rows.

Although specific embodiments have been illustrated and described, it will be obvious to those skilled in the art that various modifications may be made without departing from what is intended to be limited solely by the appended claims.

What is claimed is:

1. An apparatus provided for selecting high-reliability integrated circuits, said apparatus comprising:

two pattern boards for providing testing signals for the tested integrated circuits and amplifying the testing signals;

a main board for receiving said amplified testing signals from said pattern board, wherein the testing signals pass through electronic circuits in said main board;

a signal board for receiving said amplified testing signals from said other pattern board, wherein the testing signals pass through electronic circuits in said signal board which can be removed from said apparatus;

a plurality of daughter cards for receiving the signals from said main board and said signal board, wherein the testing signals pass through electronic circuits in said plurality of daughter cards which can be removed from said apparatus;

a plurality of socket cards for receiving the signals from said plurality of daughter cards, wherein the signals are sent to the integrated circuits supported by sockets in said plurality of socket cards which can be removed from said apparatus;

a feedthrough card for directing the testing signals from said pattern board to said main board, and other feedthrough card for directing the testing signals from said other pattern board to said signal board; and a plurality groups of needle conductors in rows, wherein some groups of said needle conductors in rows are used for signal transmission between two said pattern boards, some groups of said needle conductors in rows are used for signal transmission between said main board and said plurality of daughter cards, some groups of said needle conductors in rows are used for signal transmission between said signal board and said plurality of daughter cards, and some groups of said needle conductors in rows are used for signal transmission between said plurality of daughter cards and said plurality of socket cards.

2. The apparatus according to claim 1, wherein said pattern board, said feedthrough card and said main board all lie in the same plane, and said other pattern board, said other feedthrough card and said signal board all lie in another same plane.

3. The apparatus according to claim 1, wherein two said pattern boards are multilayer printed circuit boards in the side of each of which there are four groups of signal-transmission connections of 100 pins, wherein each of said pattern boards provides 256 different testing signals.

4. The apparatus according to claim 1, wherein said main board is a multilayer printed circuit board in the side of which there are four groups of signal-transmission connections of 100 pins.

5. The apparatus according to claim 1, wherein said signal board is a multilayer printed circuit board in the side of which there are four groups of signal-transmission connections of 100 pins.

6. The apparatus according to claim 1, wherein two said feedthrough cards are multilayer printed circuit cards.

7. The apparatus according to claim 1, wherein said plurality of daughter cards are multilayer printed circuit cards fixed under said main board by screws, wherein each of said daughter cards is responsive to each of said socket cards.

8. The apparatus according to claim 1, wherein said plurality of socket cards are multilayer printed circuit cards in each of which there are a plurality of sockets, wherein said plurality of socket cards are fixed over said main board by screws.

9. The apparatus according to claim 1, wherein said signal board is over said plurality of socket cards.

10. The apparatus according to claim 1, wherein some groups of said needle conductors in rows are inserted between said main board and said plurality of daughter cards, some groups of said needle conductors in rows are inserted between said signal board and said plurality of daughter cards, some groups of said needle conductors in rows are inserted between two said pattern boards, and some groups of said needle conductors in rows are inserted between said plurality of daughter cards and said plurality of socket cards.

* * * * *